United States Patent [19]

Mundinger et al.

[11] Patent Number: 5,105,429
[45] Date of Patent: Apr. 14, 1992

[54] MODULAR PACKAGE FOR COOLING A LASER DIODE ARRAY
[75] Inventors: David C. Mundinger, Stockton; William J. Benett; Raymond J. Beach, both of Livermore, all of Calif.
[73] Assignee: The United States of America as represented by the Department of Energy, Washington, D.C.
[21] Appl. No.: 549,509
[22] Filed: Jul. 6, 1990
[51] Int. Cl.$^5$ .............................................. H01S 3/04
[52] U.S. Cl. ..................................... 372/34; 372/36; 372/35; 357/74; 357/81; 357/82
[58] Field of Search ............... 372/34, 35, 36; 357/74, 357/81, 82

[56] References Cited

U.S. PATENT DOCUMENTS

| | | | |
|---|---|---|---|
| 4,315,225 | 2/1982 | Allen, Jr. et al. | 362/35 |
| 4,393,393 | 7/1983 | Allen, Jr. et al. | 357/81 |
| 4,574,470 | 3/1986 | Burt | 357/82 X |
| 4,589,116 | 5/1986 | Westermeier | 372/36 |
| 4,592,059 | 5/1986 | Westermeier | 372/36 |
| 4,627,062 | 12/1986 | Bender | 372/36 |
| 4,672,736 | 6/1987 | Westermeier | 29/569 |
| 4,758,926 | 7/1988 | Herrell et al. | 357/82 X |
| 4,791,634 | 12/1988 | Miyake | 372/34 |
| 4,809,058 | 2/1989 | Funamoto | 357/82 |
| 4,881,237 | 11/1989 | Donnelly | 372/50 |
| 4,894,709 | 1/1990 | Phillips et al. | 357/82 |
| 4,956,746 | 9/1990 | Gates, Jr. et al. | 357/82 X |

OTHER PUBLICATIONS

R. Beach et al., "High Reliability Silicon Microchannel Submount for High Average Power Laser Diode Arrays", Appl. Phys. Lett., vol. 56, p. 2065, May 21, 1990.
T. J. Bland et al., "A Compact High Intensity Cooler", P#831127, 13th Intersociety Conf. on Env. Systems, San Francisco, Calif., Jul. 11-13, 1983.
J. P. Donnelly et al., "Hybrid Approach to Two-Dimensional Surface-Emitting Diode Laser Arrays", Appl. Phys. Lett., vol. 53, No. 11, pp. 938-940, (1988).
M. G. Grote et al., "Test Results of Wafer Thin Coolers at Heat Fluxes from 5 to 125W/cm$^2$", P#880997, Soc. of Automotive Engineering, San Francisco, Calif., Jul. 1986.
D. Mundinger et al., "High Average Power 20D Laser Diode Arrays on Silicon Microchannel Coolers", Conf. on Lasers and Electro-Optics, Baltimore, Md., Apr. 24-28, 1989.
D. Mundinger et al., "Laser Diode Coolign for High Average Power Applications", SPIE OE Lase 89, Los Angeles, Calif. Feb. 15-20, 1989.
R. J. Phillips, "Microchannel Heat Sinks", The Lincoln Lab J., vol. 1, No. 1, pp. 31-48, (1988).
D. B. Tuckerman et al., "High Performance Heat Sinking for VLSI", IEE Elec. Device Lett., vol. EDL-2, No. 5, pp. 126-129, May, 1981.
D. B. Tuckerman, "Heat -Transfer Microstructures for Integrated Circuits", Ph.D. Thesis, Stanford Uni., UCRL-53515, Feb. 1984).

Primary Examiner—Georgia Epps
Attorney, Agent, or Firm—Henry P. Sartorio; L. E. Carnahan; William R. Moser

[57] ABSTRACT

A laser diode array is disclosed that includes a plurality of planar packages and active cooling. The laser diode array may be operated in a long duty cycle, or in continuous operation. A laser diode bar and a microchannel heat sink are thermally coupled in a compact, thin planar package having the laser diode bar located proximate to one edge. In an array, a number of such thin planar packages are secured together in a stacked configuration, in close proximity so that the laser diodes are spaced closely. The cooling means includes a microchannel heat sink that is attached proximate to the laser bar so that it absorbs heat generated by laser operation. To provide the coolant to the microchannels, each thin planar package comprises a thin inlet manifold and a thin outlet manifold connected to an inlet corridor and an outlet corridor. The inlet corridor comprises a hole extending through each of the packages in the array, and the outlet corridor comprises a hole extending through each of the packages in the array. The inlet and outlet corridors are connected to a conventional coolant circulation system. The laser diode array with active cooling has application as an optical pump for high power solid state lasers. Further, it can be incorporated in equipment such as communications devices and active sensors, and in military and space applications, and it can be useful in applications having space constraints and energy limitations.

14 Claims, 4 Drawing Sheets

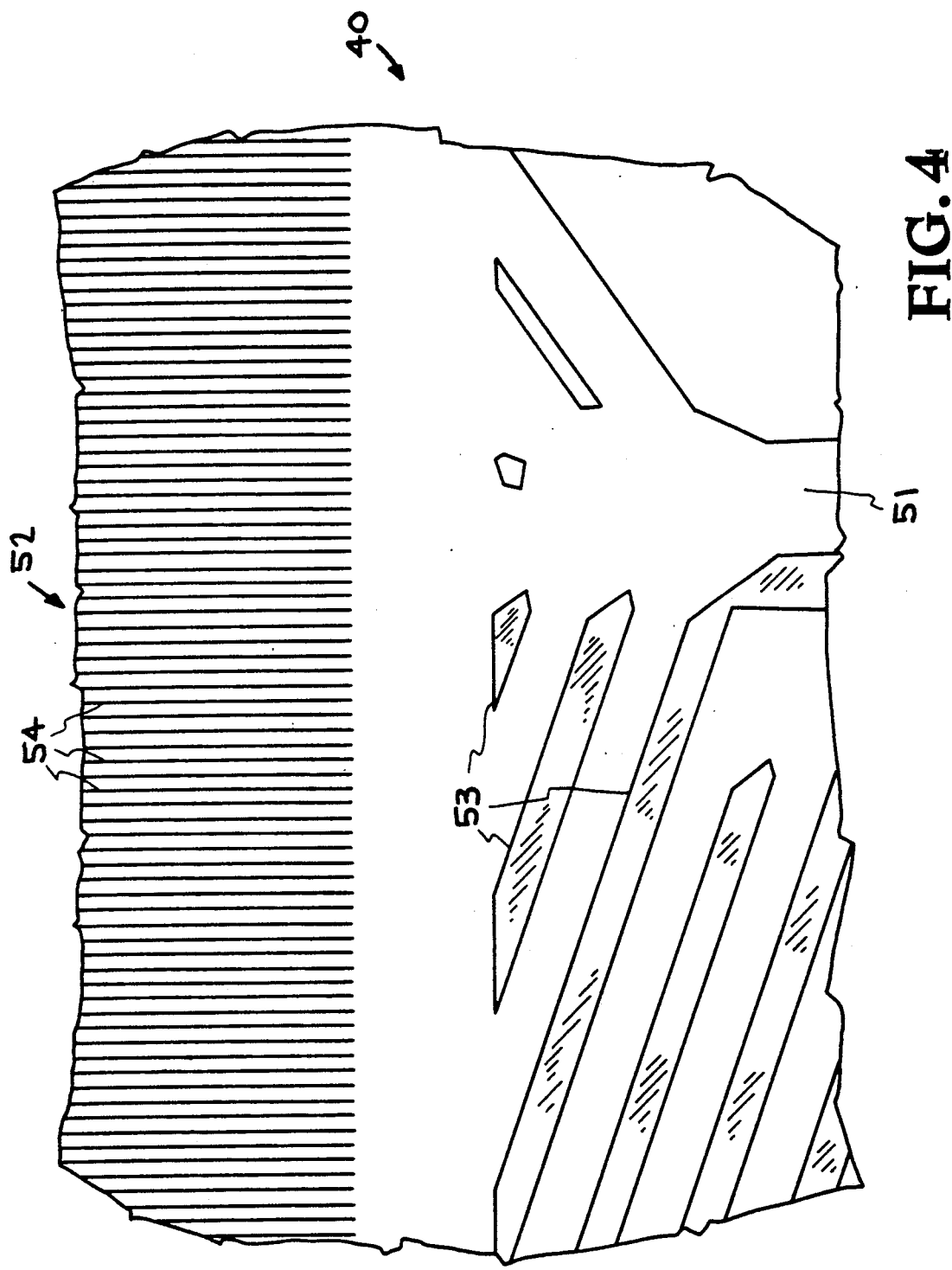

MODULAR PACKAGE FOR COOLING A LASER DIODE ARRAY

The United States Government has rights in this invention pursuant to Contract No. W7405-ENG-48 between the United States Department of Energy and the University of California for the operation of Lawrence Livermore National Laboratory.

BACKGROUND OF THE INVENTION

1. Field of the Invention

The present invention relates to laser diodes and arrays of laser diodes, and further relates to an apparatus for cooling laser diodes during operation. More specifically, the present invention relates to a laser diode array that is actively cooled and provides a laser output having a high average intensity.

2. Description of Related Art

Laser diodes have many advantages over conventional lasers. Laser diodes are small and compact, they are efficient at converting electrical energy into laser energy, and they are reliable. However, when a laser diode is operated at a high average power, it generates a substantial amount of heat in a small volume, thereby raising the temperature of the diode which causes negative effects such as a wavelength shift and a loss of efficiency. If the temperature gets high enough, destruction of the diode package may result. Therefore, present uses of laser diodes are generally limited to applications requiring low average power.

Laser diodes have some similarities to Light Emitting Diodes (LEDs). A typical laser diode is comprised of a semiconductor material, such as Gallium Arsenide (GaAs), that is manufactured to have a pn junction. Like laser diodes, LEDs have a pn junction formed in the semiconductor material. Briefly, the electroluminescence at a pn junction is the result of electrical current applied across the pn junction, associated with the band properties of semiconductor material. As a result of these band properties, an electron may combine with a hole (a lack of an electron) in a recombination that produces radiation. In a typical LED, the effect of an increase in current is to increase the radiative recombination rate well above that of the non-radiative recombination rate. Laser diodes have an additional feature over the LED—facets (reflective surfaces) on each end of pn junction. These facets define a laser cavity, which causes laser oscillation to occur along the length of the pn junction.

The laser diode is a well-known source of laser radiation. The word "laser" is actually an acronym for "Light Amplification by Stimulated Emission of Radiation". The light produced from a laser has many known applications, and it is reasonable to expect that many applications of the laser have yet to be discovered. Laser radiation has application in a wide variety of disciplines, such as communications, medicine, the military, research, and any other field where directed electromagnetic radiation is an advantage.

When compared with other lasers, the laser diode is distinguishable by several features. One distinguishing feature is the size of the laser diode. Laser diodes can be manufactured in a package much smaller than other laser devices such as gas lasers that require larger gas tubes and specialized optics equipment such as Brewster windows, mirrors, spatial filters, and lenses. Another distinguishing feature of the laser diode is its efficiency at converting the input electrical power to output laser intensity. Laser diodes can readily achieve efficiencies of 50% or more in converting electrical energy to laser energy, while other lasers have efficiencies from 10% to less than 1%. For example, the highest efficiency achieved by other lasers is attained by the $CO_2$ laser, which may attain an efficiency of 10%. Despite the advantage of high efficiency, laser diodes have not been applied in high power applications due primarily to the problem of heat dissipation. Other lasers, such as the copper vapor lasers currently in use for high power applications, have an efficiency of 1% or less. Additional distinguishing features of the laser diode include a fast response to control signals, and simplicity of design. Manufacturing of laser diodes is known in the art, and a capability exists to manufacture many types of laser diodes.

One type of laser diode is the edge emitting laser diodes, often termed "laser diode bars". These diodes emit laser light along a length of their edge. For example, an edge emitting laser diode can output a beam that has an emitting edge length of one centimeter, and a width of 0.3 mm. Typically, an edge emitting laser diode will be manufactured of a single block of GaAs, with a pn junction formed in a plane throughout the block, and the facets positioned on opposing edges of the plane defined by the pn junction. Conductors are constructed on each side of the pn junction so that when current is applied, current passes through the pn junction. The current creates a population inversion across the pn junction, and lasing action can occur.

For any laser diode, heat production is directly associated with the output intensity. Further, a high output intensity results from a large current applied to the diode. The basic mechanisms leading to heat production in a diode are the series resistances of the diode and non-radiative recombination. The series resistances include the resistance of the semiconductor material, and the resistance of the contacts, which produce heat during current flow. The resistances produce heat as current is applied, in an amount of heat flux proportional to $I^2R$.

Due to this heat production, a basic limitation on the output intensity of a diode is temperature buildup from heat produced in the pumping process. For maximum efficiency, a diode must have a temperature that is below 25° C. For reliable, long lived operation of the diode, temperatures may be less than 50° C. without substantial loss of efficiency. Temperatures even moderately above 50° C. will substantially affect efficiency and reliability, substantially shortening the useful life of the diode. Furthermore, at higher temperatures the output light will be shifted in wavelength. High temperatures encourage the growth of defects in the laser diode, which decrease efficiency. A larger current may be applied to compensate for the decreased efficiency, which then produces even more heat, encouraging the growth of even more defects and a greater loss of efficiency. If a diode could be maintained at or near its optimum temperature, then the diode will have its maximum efficiency and lifetime, and emit a consistent wavelength.

To reduce the temperature of the diode to an acceptable level while providing a high average output power, diodes are often operated in a pulsed mode wherein current is applied to the diode during only a portion of the operating time. In this mode, the heat has an opportunity to dissipate during the time when current is off.

In the pulsed mode of operation, a figure that describes the percentage of time that the diode is pulsed is the "duty cycle". For example, a duty cycle of 1% corresponds to a diode that is actuated with current only once in 100 cycles. Typically, laser diodes will be operated at a duty cycle of 1% and a supplied current of fifty amps/cm of length. However, if some extra cooling is available, higher duty cycles can be attained. If much more substantial cooling were available, continuous (cw) operation may be obtainable for optimum current levels. The cooling problem is of particular significance for arrays of laser diodes.

Arrays of laser diodes include a number of laser diodes positioned closely together. Laser diode arrays may be manufactured in various architectures such as the stacked architecture and the monolithic surface emitting architecture. In one configuration (the "rack and stack" configuration) the laser diodes are positioned in a stacked configuration, one on top of the other. In another configuration, the monolithic surface emitting architecture, a number of edge emitting laser bars are positioned on the surface of a thermally conductive material, next to reflectors angled at 45°. Thus, the laser radiation from the laser diode bars is first emitted in a direction along the surface of the block, but is then reflected upward by angled reflectors on the block's surface.

A feature of laser diode arrays is the high intensity output provided from the closely packed laser diodes. Another advantage of diode arrays is that the output beam's area can be made larger simply by increasing the area of the array. To obtain the higher intensity, the laser diodes in the array should be positioned closer together. However, as a result of close positioning, the heat flux from each laser bar will add with the heat flux of the adjoining laser bar, and without aggressive cooling the temperature may increase rapidly. At a high output power (a high intensity and long duty cycle), the amount of heat flux produced in each diode becomes very substantial.

As a result, the average output intensity of a diode array is substantially limited by its ability to sink heat. Using only ambient air cooling, average power output must be limited by maintaining the current and duty cycle at a level sufficient to prevent damaging temperature buildup. There is a tradeoff between output power and output pulse duration; a long duty cycle must be balanced by a small current, and conversely, a large current must be balanced by a short duty cycle. The heat flux in a diode array is substantial during a period of high output. Without additional cooling, a laser diode array operated at a high average power will produce a large heat flux which can cause a rapid temperature increase, leading to device failure and other temperature associated problems discussed above. Therefore, a higher intensity output will generally require a more effective cooling system.

Two performance figures of merit for cooling purposes are thermal resistance and temperature uniformity. Thermal resistance is defined as the temperature rise at the laser junction relative to the coolant inlet temperature, per watt/cm$^2$ of heat load. The causes and effects of heat load have been discussed above.

Temperature uniformity is a measure of the maximum temperature variation across the surface where the heat is applied. Lack of temperature uniformity could be caused by coolant heating or variations in heat load or thermal resistance, For applications such as high power laser diode arrays, a heat sink should have figures for thermal resistance and temperature uniformity small enough to dissipate the large amount of heat generated by high average power operation. In these high power applications, if a heat sink were available that had low figures for thermal resistance and temperature uniformity, the cost per watt of output laser power would be reduced significantly.

Another problem that arises in high average power laser diode arrays is thermal expansion mismatch. A material's thermal expansion coefficient describes the extent of the material's expansion caused by a temperature change. If two materials that have a thermal expansion mismatch are bonded together, then a temperature change may result in a cracking of the structure of one material or the other, or it may result in a compromise of the bond between the two materials. Gallium Arsenide (GaAs) is a conventional material for laser diodes; its thermal expansion coefficient is different than that of, for example silicon (Si), and many other materials.

Problems with low temperature uniformity, thermal resistance, and thermal expansion mismatch exist with regard to the stacked arrays. To address these problems, it has been suggested that thermally conductive material having a similar expansion coefficient be placed between the diode bars, in a "rack and stack" architecture. The thermally conductive material may be copper or a copper-tungsten alloy, such as Thermkon®, a General Electric product, that is matched to the thermal expansion constant of GaAs. This material may be made thick to absorb excess heat. However, the thermal conductance of copper or Thermkon® is insufficient for operation at a high duty cycle. Another product used in the rack and stack architecture is beryllium oxide (BeO), which has an even lower thermal conductance, and therefore allows an even smaller duty cycle. BeO is used because its thermal expansion matches the thermal expansion of GaAs, therefore it provides a structurally sound package even while operating at high temperatures. It has also been suggested that a diamond material be used in the rack and stack architecture. Diamond has a high thermal conductivity; however, manufacturing is difficult and costly due to the diamond's hardness.

It would be an advantage if a laser diode could be cooled sufficiently to produce a high average power. It would be a further advantage if the laser diode and its cooling means were provided in a thin, easily constructed package that can be closely stacked in an array of laser diodes. Such a laser diode array would have many uses including application as an efficient pump source for pulsed solid state lasers.

Microchannel coolers (i.e., silicon wafers with small channels etched therein) have been used to cool integrated circuits, however they have not been applied in a practical way to cool laser diodes. One problem is the mismatch in thermal expansion between GaAs and silicon; the mismatch may lead one to the conclusion that a direct bond between the GaAs laser diode and the silicon wafers would lead to cracking of either the GaAs or the silicon, or failure of the bond between them. To avoid this problem, it has been suggested to use a material that matches the thermal expansion of GaAs, and insert that material between the GaAs and the silicon microchannel. A disadvantage of this approach is the increase in cost of manufacturing and the increase in size. The larger size increasing the area over which the laser's energy is spread, thereby decreasing output intensity.

Other problems in applying microchannel cooler technology to laser diodes include: delivering coolant to the microchannels proximate to the diode so that a high flow rate can be achieved, and mounting the diodes closely in an array to provide a high output intensity while still providing substantial cooling.

Conventional laser diode arrays have been formed of a number of laser diodes structurally connected together in such a manner that replacing a laser diode that is non-functional or otherwise not working is difficult or impossible. This disadvantage is particularly acute in manufacturing laser diode arrays; testing each of the laser diodes before installation is difficult. If it is later discovered that the one or more of the laser diodes does not function properly, then the whole array may have to be scrapped or remanufactured at a substantial cost. It would be an advantage to provide a package that has an edge emitting laser diode bar and a heat sink that can remove a significant amount of heat from the laser diode so that the laser diode can be operated at a high average power. It would be an advantage if the laser diode array could be formed of a number of similar laser diode and cooling packages that are interchangeable and easily replaceable, so that if a particular package becomes inoperable or of poor quality, then the package can be easily replaced at low cost without affecting the remainder of the diode array.

SUMMARY OF THE INVENTION

The present invention provides an apparatus for cooling laser diode arrays. The invention comprises a diode-cooler package that provides a large amount of cooling in a small package. The diode-cooler packages are designed to be closely stacked, one on top of the other, to create a structure having a high average output intensity. If more optical energy is required, the size of the stack is increased with additional diode-cooler packages. The amount of cooling is sufficient to produce a high average power output intensity from the laser diode arrays efficiently and over a long period of time without damage to the array. Thus, using the principles of the present invention, a laser diode array may be operated for extended periods of time at high intensity. The mode of laser operation may include a long duty cycle, or even continuous operation.

The present invention comprises a laser diode and cooling means that are connected in a compact, thin planar package having the laser diode located proximate to one edge. In an array, a number of such thin planar packages are secured together, one on top of the other. In this array, the packages are connectable in close proximity so that the laser diodes in each are very closely spaced and provide a high intensity output over an area as large as the number of packages.

The cooling means includes a microchannel heat sink that is attached proximate to the laser diode bar so that it absorbs heat generated in the laser diode bar. The microchannel heat sink comprises a substrate having a plurality of microchannels formed therein which guide a coolant such as water flowing through them. To provide the coolant to the microchannels, each planar package comprises a thin inlet manifold and a thin outlet manifold connected to an inlet corridor and an outlet corridor. The inlet corridor comprises a hole extending through each of the packages in the array, and likewise the outlet corridor comprises a hole extending through each of the packages in the array. The inlet and outlet corridors are connected to a conventional coolant circulation system. In operation, coolant provided in the inlet corridor flows first into and through the inlet manifold, and then into the microchannel coolers where heat from the laser diodes is absorbed. From there, the heated coolant flows through the outlet manifold and into the outlet corridor. The thinness of the manifolds is an advantage because the laser diodes can be positioned in close proximity for high intensity over a large area, while maintaining a low temperature due to the cooling action of the microchannel coolers. The inlet corridor and the outlet corridor is common to all the planar packages in the array, and thus a single coolant circulation system is connected to the array.

The present invention has application as an optical pump for high power solid state lasers. Laser diodes provide a substantial advantage when compared with flashlamps, the conventional choice for pumping solid state lasers. Laser diodes have a very long life, and are known to be reliable in operation over long periods of time. As a further advantage, laser diodes can output single frequency radiation which can be matched to the peak absorption of the solid state laser gain material. Additionally, the laser diode's conversion of electrical energy to optical energy is very efficient; laser diodes require only modest electrical voltage and power. In comparison, flashlamps are less efficient and require electrical energy with high power and high voltage. Thus, the present invention provides the basis for efficient high power solid state lasers. The present invention can be incorporated in equipment such as communications devices and active sensors. The present invention can provide optical sources having small size and efficient conversion of electrical energy to laser light, and thus the present invention may be applied for use in military and space applications, and in other applications that have space constraints and energy limitations.

BRIEF DESCRIPTION OF THE DRAWINGS

FIG. 4 is a sectional view of a portion of the top wafer of the planar package viewed from the bottom, illustrating the microchannel coolers and the coolant manifold.

DETAILED DESCRIPTION OF THE INVENTION

The invention is best understood by reference to the figures wherein like parts are designated with like numerals throughout. This section begins with a general description, followed by a more specific description wherein the preferred embodiment is described in more detail.

GENERAL DESCRIPTION

Figure 1:
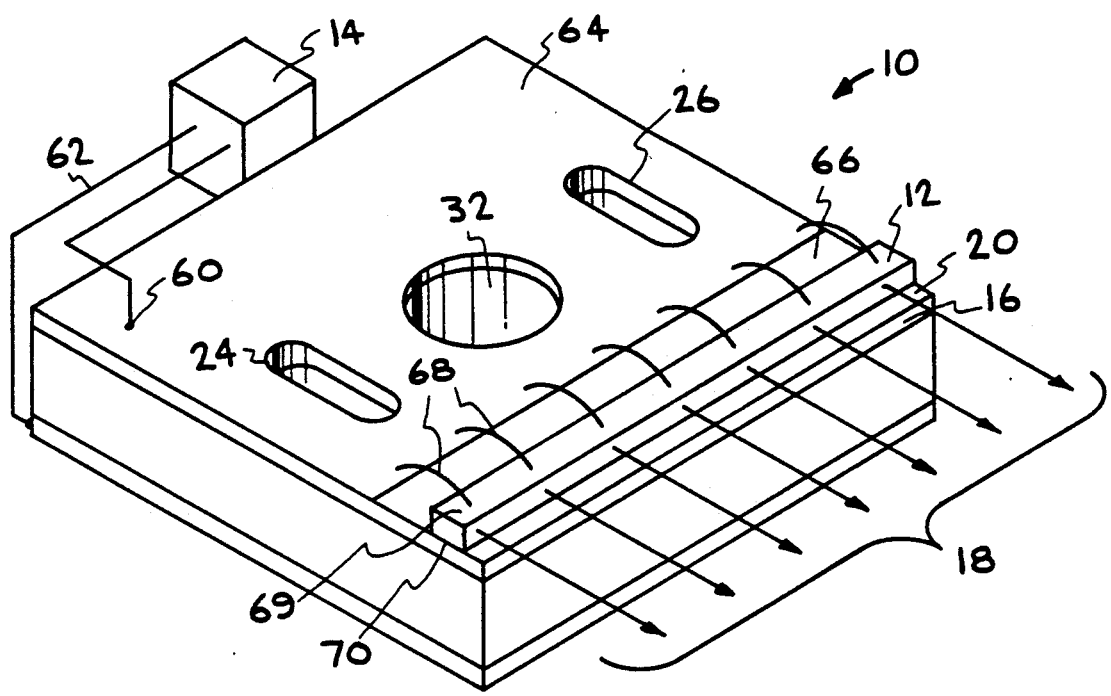
FIG. 1 is a perspective view of a thin planar package including a laser diode bar and cooling means.
Figure 2:
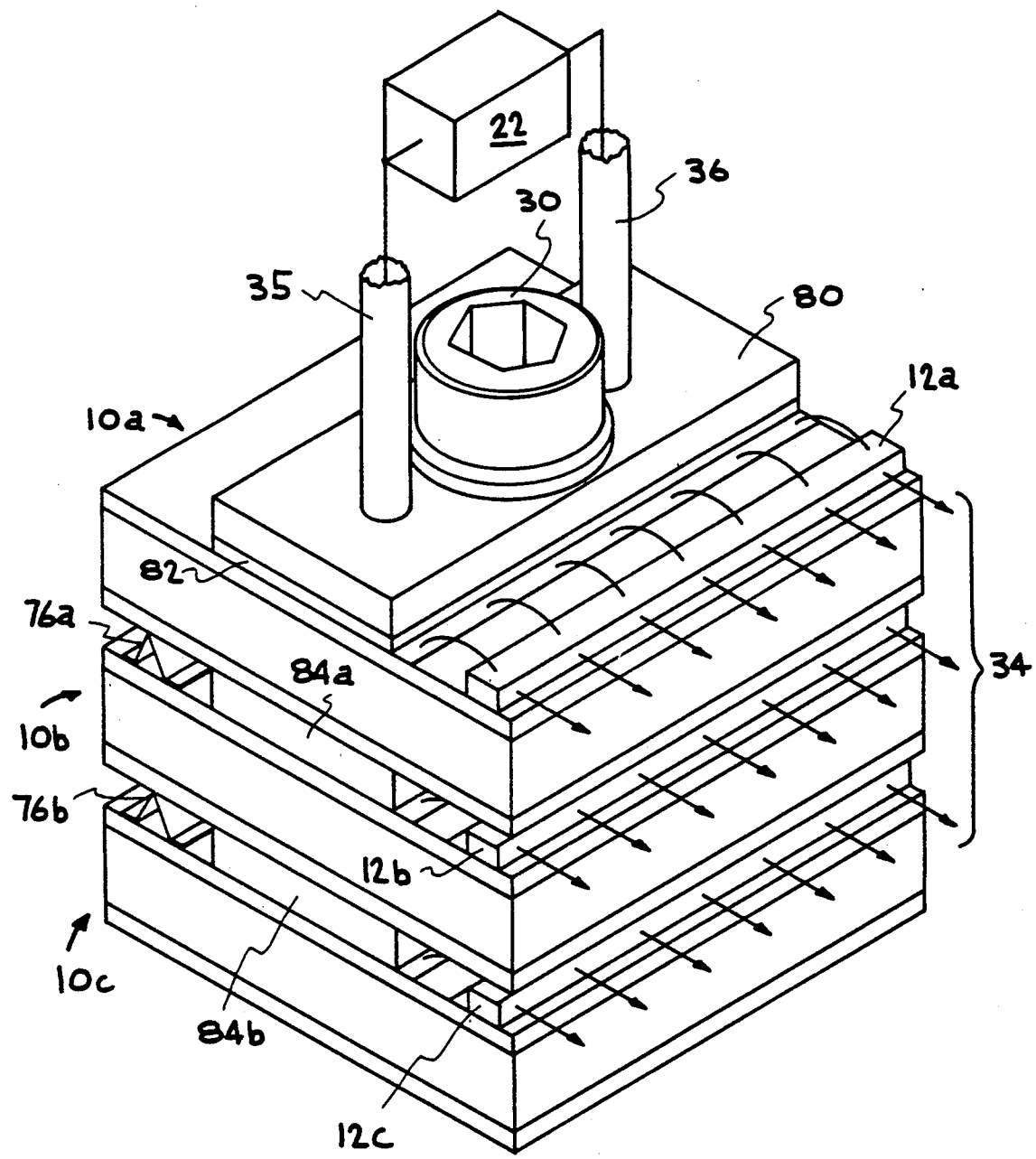
FIG. 2 is a perspective view of a diode array comprising a plurality of thin planar packages connected together.

As illustrated in FIGS. 1 and 2, the present invention comprises a compact, thin planar package shown generally at 10 in FIG. 2, including a laser diode bar 12 and cooling means internal to the package 10. Electric current is provided to the laser diode bar 12 by a conventional electric current source 14. The laser diode bar 12 is positioned proximate to the edge 16 so that emitted laser light 18 is substantially unobstructed by the top surface 20. Coolant such as water is circulated through the package 10 by a conventional coolant circulation system 22. Coolant enters the package 10 through an inlet corridor 24, and exits through an outlet corridor 26.

When a plurality of these packages 10 are connected to form an array, as illustrated in FIG. 2, a number of the thin planar packages 10 are secured together in a stacked arrangement. In the illustrated embodiment, the planar packages 10 are secured together by a bolt 30 extending through a hole 32 (FIG. 1) formed in the packages 10. FIG. 2 illustrates three packages 10a, 10b, 10c; in other embodiments, an array may comprise any number of the packages 10 from two and up. On the bottom side of the bottom package 10c, the bolt 30 is secured by a nut (not shown). Coolant is provided from the coolant circulation system 22 through an inlet tube 35 and an outlet tube 36. In an array, the thin packages 10 are connectable in such close proximity that the laser diode bars 12 are very closely spaced and therefore provide a high intensity laser output 34 over an area as large as the number of packages 10.

Figure 3:
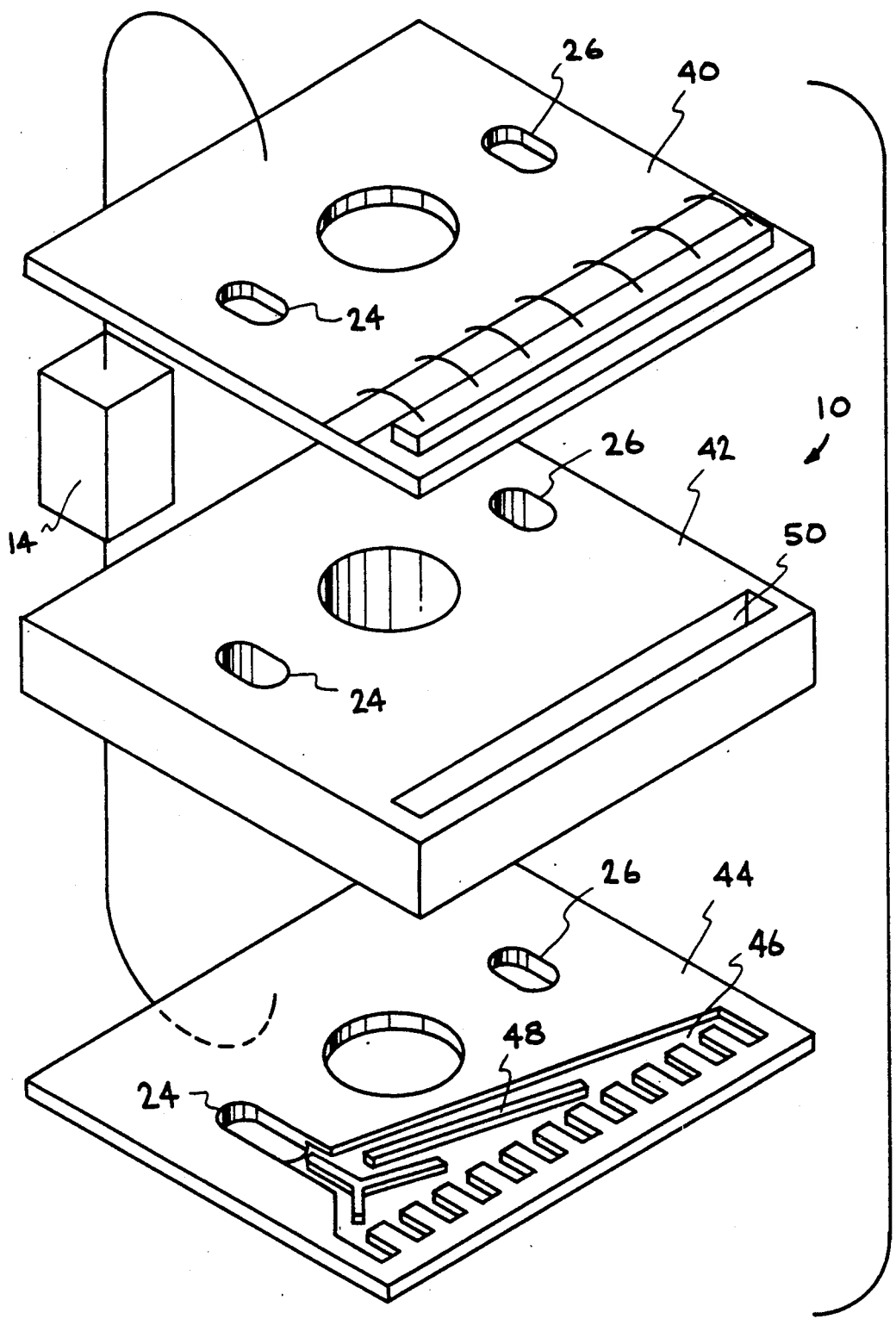
FIG. 3 is an exploded view of the thin planar package, illustrating its construction in three wafers: a top wafer on which the laser diode bar is mounted, a middle wafer, and a bottom wafer.

As illustrated in FIG. 3, each package 10 is constructed of three separate wafers 40,42,44. When bonded together, the wafers 40,42,44 provide the package 10 that has cooling means integral therein. The top wafer 40 preferably comprises a silicon substrate, the middle wafer 42 comprises a glass material, and the bottom wafer 44 preferably comprises a silicon substrate. The bottom wafer 44 comprises a manifold 46 that is etched on its top surface. The manifold 46 may comprise a series of ribs, such as the rib 48 which provides structural strength to the manifold 46. When the bottom wafer 44 is bonded to the middle wafer 42, the manifold 46 forms a passageway for coolant flow between the inlet corridor 24 and a slot 50 formed in the middle wafer 42.

FIG. 4 is a sectional view of a portion of the top wafer 40, viewed from the bottom. A manifold 51 is formed therein to create a passageway for coolant flow between the outlet corridor 26 and a microchannel heat sink 52. A plurality of ribs 53 are provided in the manifold 51, which provide structural strength to the manifold 51. The heat sink 52 is formed in the top wafer 40 proximate to the laser diode bar 12. In that position, the heat sink 52 conducts heat away from the laser diode bar 12, to the coolant flowing through it. The heat sink 52 comprises a plurality of microchannels 54 formed in the substrate of the silicon wafer 40 in accordance with conventional techniques.

Figure 5:
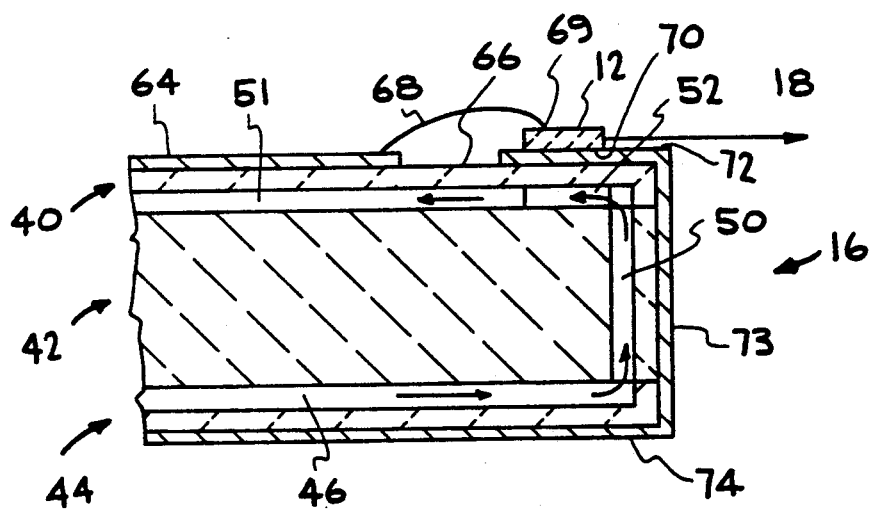
FIG. 5 is a cross section of the thin package, illustrating the flow of coolant through the package.

In operation, as illustrated in FIG. 5, and with reference to FIGS. 1 and 3, coolant provided in the inlet corridor 24 flows into and through the inlet manifold 46, and then into the slot 50. From there, coolant flows into the microchannel heat sink 52 where heat from the laser diode bar 12 is absorbed. Then, the heated coolant flows through the manifold 51 formed in the top wafer 40, and into the outlet corridor 26 where it is cooled and recirculated by the coolant circulation system 22. In an array, the inlet corridor 24 and the outlet corridor 26 is common to all the planar packages 10 in the array, and thus only a single coolant circulation system 22 (FIG. 2) is required for the entire array.

In an array of packages 10, the thinness of the wafers 40,42,44 is an advantage because the laser diode bars 12 can be positioned in close proximity for high intensity output 34 over a large area, while maintaining a low temperature due to the cooling action of the microchannel heat sinks 52. Although for illustration purposes the packages 10 appear to be rectangular boxes, in the preferred embodiment the packages 10 are thin planar packages, and therefore can be placed closely together.

MORE SPECIFIC DESCRIPTION

As shown in FIG. 1, the present invention comprises the compact, thin planar package shown generally at 10, including the laser diode bar 12. The laser diode bar 12 may comprise any of a number of commercially available semiconductor laser diode bars, available from a number of manufacturers such as Siemens AG of Munich, West Germany, and Applied Solar Energy Corp. of City of Industry, Calif.

When a raw diode block is obtained from the manufacturer, the block typically comprises a thin, square piece of semiconductor material, such as Gallium Arsenide (GaAs) with the pn junction formed throughout the square in a plane parallel to the square's surface. Furthermore, the crystal axes in the semiconductor are formed so that they are perpendicular to an edge. Using this diode square, the individual diode bars are formed by first using a conventional scribe tool, which nicks the edge of the square semiconductor material at fixed intervals. Using the nicks as a guide, the square is separated by a conventional cleaving device into a number of bars by breaking the square along the crystalline axes. The bars are finally cleaned by conventional plasma ashing, which turns any trace of organic materials into an ash which can be easily removed. A smooth facet is formed by this process, which is then made reflective by conventional techniques. In the preferred embodiment, the output facet is coated with one-half wave thickness $Al_2O_3$, and the rear facet is coated with a quarter wave stack of eight layers of $TiO_2/SiO_2$.

The laser diode bar 12 is positioned proximate to the edge 16 so that the emitted laser light 18 is substantially unobstructed by the top surface 20. Preferably, the laser diode bar 12 is bonded to the top wafer 40 using a conventional indium solder. In the preferred bonding technique, the laser diode bar 12 is clamped to the top wafer 40 by a clamp that has an elastomer edge that presses the length of the bar 12 into tight contact with the evaporated indium solder that was formed on the wafer 40. The bar 12 and the wafer 40 are then heated enough that the solder melts, and then cooled to form a solid mechanical and electrical bond. Although the diode bar 12 is illustrated in the Figures as a single long bar of semiconductor material, in practical application two or more separate shorter bars of semiconductor material, placed end to end, may be utilized instead of the single longer bar.

Electric current is provided to the laser diode bar 12 by the conventional electric current source 14. In the planar package 10, the electric current is delivered through a first terminal 60 provided on the top of the top wafer 40, and a second terminal 62 provided on the bottom of the bottom wafer 44. For purposes of illustration, the first terminal 60 will be assumed to be the positive terminal 60, and the second terminal will be assumed to be the negative terminal 62. Following the flow of electric current from positive to negative with reference to FIGS. 1 and 5, the electric current flows into the positive terminal 60 and along the top surface of the top wafer 40, via a metallized portion 64. The metallized portion 64 extends from the terminal 60 to a series of wires 68 which are connected to the laser diode 12.

The metallized portion 64, and all other metallized portions preferably comprise a gold conductive layer. In the preferred embodiment, a thin (1000 Å) layer of titanium is formed directly on the wafer 40, and a thin (1000 Å) layer of platinum is formed on top of the titanium. The gold conductive layer is then formed on top of the platinum, in a thickness sufficient to carry the current, for example 1.5 microns. Where the laser diode bar 12 connects with the wafer 40, another 1000 Å layer of titanium or platinum is formed on top of the gold conductive layer, a thin layer (1000 Å) of gold is formed on top of the titanium or platinum, and the indium solder is evaporated on top of the thin gold layer, to provide a connection between the top wafer 40 and the laser diode bar 12.

The top surface of the top wafer 40 has a nonconductive electrical break 66, which prevents flow of electrical current. Over this electrical break 66, a series of wires 68, preferably gold wires, electrically connect the metallized portion 64 with an electrode 69 disposed on top of the laser diode bar 12.

In the laser diode bar 12, electrical current flows between the top electrode 69 and an electrode 70 on the bottom, providing current through a semiconductor junction to cause emission of the laser radiation 18. Assuming the direction of current flow is the same as in the previous paragraphs, the top electrode 69 is the anode, and the bottom electrode 70 is the cathode of the laser diode bar 12. The electrode 70 on the bottom of the laser diode bar 12 is electrically connected to the top wafer 40, in another metallized portion 72. Thus, current flows from the bottom electrode 70, into the metallized surface 72. The portion 72 that is metallized continues around the corner of the top wafer 40, and contacts a metallized portion 73 of the middle layer 42, which in turn contacts a metallized portion 74 of the bottom layer 44, which is connected to the negative terminal 62 (FIG. 1). Thus, a current path is provided from the laser diode bar 12 along the front edge 16 of the package 10, including a metallized portion 72 of the top wafer 40, the metallized front edge 73 of the middle wafer 42, and the metallized portion 74 of the bottom wafer 44 which is connected to the negative terminal 62 in the preferred embodiment.

In an array as illustrated in FIG. 2 wherein a plurality of planar packages 10 are stacked together, metal clips 76 are disposed between adjacent packages 10. For example, the metal clip 76a, disposed between the package 10a and the adjacent package 10b, electrically connects the metallized bottom surface 74 of the planar package 10a with metallized top portion 64 of the planar package 10 below it. When a plurality of such clips 76 are connected between each of the planar packages 10, then the laser diode bars 12 are electrically connected in series. To select a desired intensity of the laser output 34, the electrical current source 14 is operated to provide a level of electrical current that provides the desired output intensity.

A suitable coolant such as water is circulated through the package 10 by the conventional coolant circulation system 22. The planar packages 10 of the preferred embodiment have been operated with a coolant circulation system 22 that comprises a Neslab chiller that provides 55 psi. However, the planar packages 10 have been tested to withstand a higher pressure, and therefore the coolant circulation system 22 may provide a higher pressure than 55 psi. The inlet tube 34 and the outlet tube 36 are connected to a header 80, which provides a solid structural connection between the tubes 34,36 and the corridors 24,26. A thin gasket 82 is disposed between the header 80 and the topmost package 10a. Preferably, the gasket 82 comprises a teflon material which provides a watertight seal, such as Gore-tex ®. Thus, coolant can flow into and out of the corridor 24,26 to provide coolant to the microchannel heat sinks 52 in each of the packages 10.

Reference is made to FIG. 3, wherein the inlet corridor 24 comprises holes in the wafers 40,42,44, that are aligned with each other, and likewise, the outlet corridor 26 comprises holes in the wafers 40,42,44, that are aligned with each other. In the array illustrated in FIG. 2, the plurality of packages 10 are secured together in a stacked configuration. In this array, the holes in each of the packages 10 are aligned to form a single inlet corridor 24 and a single outlet corridor 26. Between the packages 10a, 10b, a gasket 84a is positioned to provide a watertight seal. Between the packages 10b, 10c, a gasket 84b is positioned to provide a watertight seal. Preferably, the gaskets 84a,84b comprises a teflon material such as Gore-tex ®. It is desirable that the gaskets 84a,84b, are thin, because then the packages 10a,10b,10c are positioned in close proximity to each other, and the thickness of the wafers 40,42,44 determine the minimum spacing between the diode bars 12. As a result, the laser diode bars 12 are very closely spaced and therefore the array can provide a high intensity laser output 34. The active cooling of the diode bars 12 permits operation of the laser diode bars 12 at a high average power, in either a pulsed mode or a continuous mode of operation.

Because the corridors 24,26 extend from top to bottom through the array of planar packages 10, the coolant circulation system 22 may be connected to the bottom by a header similar to the header 80, on the top of the array. Alternately, if the coolant circulation system 22 were to be connected only to the top, then the bottommost package 10 in the array must be plugged by any suitable means in order to retain coolant within the corridors 24,26.

As illustrated in FIGS. 3 and 4, each package 10 is constructed of the three wafers 40,42,44. FIG. 4 is a perspective view of the top wafer 40, viewed from the bottom. The top wafer 40 preferably comprises a silicon substrate, the middle wafer 42 comprises a glass material, and the bottom wafer 44 preferably comprises a silicon substrate. The glass material of the middle wafer 42 preferably comprises a glass that is closely matched to the thermal expansion of silicon, for example Corning #7740, or equivalent.

The wafers 40,42,44 are bonded together preferably by an anodic bonding process. In the preferred bonding process, a first wafer (either the top wafer 40 or the bottom wafer 44) is positioned on a hot plate which also acts as an electrode. The middle wafer 42 is positioned with respect to the other wafer to produce the desired pattern alignment. Both wafers are heated by the hot plate to a high temperature (for example 550° F.). Then another electrode is electrically connected to the wafer 42, and a high voltage (for example 1200 volts) is applied across the two wafers, which bonds them together.

To bond the third wafer to the two-wafer bonded assembly, the third wafer is positioned on top of the middle wafer 42 in the desired pattern alignment, and then heated to a high temperature. In order to allow passage of an electrode to bond the third wafer to the two-wafer assembly, the first wafer comprises one or more holes (not shown) formed therein in any suitable location. The holes are of sufficient size and location to allow passage of an electrode so that a high voltage can be placed across the middle layer 42 and the third wafer in the bonding process. When the high voltage is applied, bonding occurs between the middle wafer 42 and the third wafer. After bonding is complete, the bonding electrode may be removed.

The bottom wafer 44 comprises the manifold 46 that is etched on its top surface, by conventional anisotropic etching techniques which etch the material along crystal axes. A similar process is used to form the manifold 51, formed in the top wafer 40. Each manifold 46,51 may comprise a series of ribs, such as the rib 48 which provides structural strength to the manifold 46, and the ribs 53 which provides structural strength to the manifold 51. The ribs 48,53 are etched along the crystalline axis, preferably at a distance of several tenths of a millimeter (for example 0.25 mm) apart. As illustrated, preferably the ribs 53 are etched in a pattern that promotes coolant flow to the microchannel heat sink 52, the pattern being designed to promote a coolant flow that is approximately even through each of the microchannels 54.

The heat sink 52 is formed in the top wafer 40 proximate to the laser diode bar 12. In that position, the heat sink 52 conducts heat away from the laser diode bar 12, to the coolant flowing through it. The microchannel heat sink 52 comprises a plurality of microchannels 54 formed in the substrate of the silicon wafer 40 in accordance with conventional techniques. Preferably, the microchannel heat sink 52 is formed by conventional anisotropic etching techniques. The microchannels preferably have dimensions comprising 25 microns in width, 125 microns in depth, and the ribs separating the microchannels are 25 microns in width.

The middle wafer 42 comprises the slot 50 which provides a passageway for coolant flow between the top manifold 51 and the lower manifold 46. The slot 50 is formed in the middle wafer 42 by ultrasonic milling, using conventional techniques.

When the bottom wafer 44 is bonded to the middle wafer 42, the manifold 46 forms a passageway for coolant flow between the inlet corridor 24 and the slot 50 formed in the middle wafer 42. Likewise the manifold 51 formed in the top wafer 40 creates a passageway for coolant flow between the outlet corridor 24 and the microchannel heat sink 52. Thus, as illustrated in FIG. 5, and with reference to FIGS. 1 and 3, a coolant path is provided from the inlet corridor 24, through the manifold 46, into the slot 50, then through the microchannel heat sink 52 where heat from the laser diode bar 12 can be absorbed, then through the manifold 51, and to the outlet corridor 26. Although the corridors 24,26 have been respectively referred to as "inlet", and "outlet" corridors, coolant could be made to flow through the package 10 in either direction. The present invention provides adequate cooling regardless of the direction of coolant flow.

Although for illustration purposes the packages 10 appear to be rectangular boxes, in the preferred embodiment, the packages 10 are much thinner planar packages, and therefore can be placed closely together. As a result, the present invention provides a high intensity output that can be maintained continuously, or at a high average power. For example, the top wafer 40, and the bottom wafer 44 have been fabricated to have a thickness of 0.017 inch (0.43 mm) each, and the middle wafer has been fabricated to have a thickness of 0.032 inch (0.81 mm). When connected together, the three wafers 40,42,44 have a combined thickness of 0.066 inch (1.67 mm). A laser diode 12 may have a thickness of 0.004 inch (0.1 mm), and the gasket 84 may have a thickness of 0.010 inch (0.25 mm). When the wafers' thickness is added to the thickness of the diode 12 and the gasket 84, the total is 0.080 inch (2.02 mm). This figure is a measure of the separation between adjacent laser diodes 12 in the array 34. These figures are of illustration purposes only, and in other embodiments, the actual thickness may be less, or more.

The present invention provides sufficient cooling to operate the laser diode in the pulsed mode or continuously at a very high average power output. The present invention has application as a pump for a high power solid state lasers. Incorporating the present invention in a conventional manner, high power lasers may be produced that the are efficient and inexpensive, and have a small size compared with lasers that are available now.

The invention may be embodied in other specific forms without departing from its spirit or essential characteristics. The described embodiment is to be considered in all respects only as illustrative and not restrictive and the scope of the invention is, therefore, indicated by the appended claims rather than by the foregoing descriptions. All changes which come within the meaning and range of equivalency of the claims are to be embraced within their scope.

We claim:

1. An apparatus for actively cooling a diode with coolant pumped by a circulation system, said apparatus comprising:

a thin planar assembly thermally and electrically connected to a diode, said planar assembly comprising a heat sink region actively cooled by a coolant, said heat sink region comprising internal microchannels, said heat sink region being thermally connected to the diode so that heat is conducted between the diode and the heat sink region, said assembly further comprising, an inlet corridor providing coolant to the assembly, an inlet manifold integral in the assembly, said inlet manifold providing coolant flow between the inlet corridor and the microchannels in the heat sink region, an outlet corridor removing coolant from the assembly, and an outlet manifold integral in the assembly, said outlet manifold providing coolant flow between the microchannels in the heat sink region and the outlet corridor, wherein the planar assembly further comprises a top layer, a middle layer, and a bottom layer bonded together;

said top layer and said middle layer defining the microchannels in the heat sink region and the outlet manifold;

said bottom layer and said middle layer defining the inlet manifold; and said middle layer comprising a slot between the inlet manifold and the microchannels in the heat sink region.

2. The apparatus as claimed in claim 1, wherein the top layer and the bottom layer comprise a substrate having a thermal expansion coefficient that is substantially similar, and wherein the middle layer comprises a material that has a thermal expansion coefficient substantially similar to the thermal expansion coefficient of the substrate of the top and the bottom layers.

3. The apparatus as claimed in claim 1, wherein the top layer comprises a substrate of silicon material, and the bottom layer comprises a substrate of silicon material.

4. The apparatus as claimed in claim 3, wherein the middle layer comprises a glass material.

5. The apparatus as claimed in claim 4, wherein the glass material of the middle layer has a thermal expansion coefficient that is substantially similar to the thermal expansion coefficient of the substrate of the top and the bottom layers.

6. The apparatus as claimed in claim 1, wherein the diode comprises an edge emitting laser diode bar connected to the assembly, said edge-emitting laser diode bar being positioned so that laser radiation emitted by the laser diode is directed substantially parallel to the plane defined by the assembly, said laser diode and said microchannels being positioned proximate to an edge of the assembly.

7. The apparatus as claimed in claim 1, wherein the assembly further comprises a means for conducting current to the diode, said means including a first metallized surface of the planar assembly, and a means for conducting current from the diode, said means including a second metallized surface of the planar assembly.

8. The apparatus as claimed in claim 7, wherein the first metallized surface is electrically connected to the laser diode by a series of wires, and the second metallized surface is electrically connected to the laser diode by a weld between the diode and the second metallized surface.

9. An array of laser diodes, comprising:
a plurality of thin planar packages actively cooled with a coolant circulation system, said packages being stacked to form the array, each of said packages having an edge-emitting laser diode mounted thereon, and each of said packages comprising:
means for cooling the laser diode mounted thereon, said cooling means including a microchannel cooler positioned under the laser diode, said microchannels having a shape to provide a passage for flow of a liquid coolant,
said edge-emitting laser diodes being positioned so they emit light in a direction substantially parallel to the planes defined by the thin planar packages;
said plurality of packages, when connected together, defining an inlet corridor that provides a passageway for coolant flow between the microchannel coolers and the coolant circulation system, and further defining an outlet corridor that provides a passageway for coolant flow between the microchannel coolers and the coolant circulation system;
wherein each planar package further comprises a top layer, a middle layer, and a bottom layer bonded together:
said top layer and said middle layer definine an outlet passageway connecting the microchannel cooler with the outlet corridor;
said bottom layer and said middle layer defining an inlet passageway connected to the inlet corridor; and
said middle layer comprising a slot defining a passageway between the inlet passageway and the microchannel cooler.

10. The laser diode array as claimed in claim 9, wherein the top layer and the bottom layer comprise a substrate having a thermal expansion coefficient that is substantially similar, and wherein the middle layer comprises a material that has a thermal expansion coefficient substantially similar to the thermal expansion coefficient of the substrate of the top and the bottom layers.

11. The laser diode array as claimed in claim 9, wherein the top layer comprises a substrate of silicon material, the bottom layer comprises a substrate of silicon material, and the middle layer comprises a glass material, and furthermore, the laser diode comprises gallium arsenide.

12. A laser diode array as claimed in claim 9, wherein the packages are aligned so that the inlet corridors of each package are aligned to form a single inlet corridor, and the outlet corridors of each package are aligned to form a single outlet corridor, and the coolant circulation system is connected to the single inlet corridor and the single outlet corridor, so that coolant is pumped into the single inlet corridor and out of the single outlet corridor.

13. A laser diode array as claimed in claim 9, wherein each of the packages comprises a first electrical conductor on their top surface, said first conductor being electrically connected with a first electrode of the laser diode having a first polarity, and each of the packages further comprise a second electrical conductor on the bottom surface, said second conductor being electrically connected with a second electrode of the laser diode having a second polarity opposite to the first.

14. A laser diode array as claimed in claim 9, wherein each planar package comprises a first metallized surface for conducting current to the laser diode, and a second metallized surface for conducting current from the laser diode, and wherein the diode array further comprises a plurality of conductors, each conductor being positioned between adjacent packages so that adjacent packages are electrically coupled, said electrical connection being between the second metallized surface of each package and the first metallized surface of the adjacent package.

* * * * *